(12) United States Patent
Ueno

(10) Patent No.: US 10,871,441 B2
(45) Date of Patent: Dec. 22, 2020

(54) DETERIORATION DETECTION SENSOR OF PRINTED WIRING BOARD

(71) Applicant: FANUC CORPORATION, Yamanashi (JP)

(72) Inventor: Fuyuki Ueno, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 84 days.

(21) Appl. No.: 16/234,111

(22) Filed: Dec. 27, 2018

(65) Prior Publication Data

US 2019/0226977 A1    Jul. 25, 2019

(30) Foreign Application Priority Data

Jan. 23, 2018   (JP) ................................ 2018-008779

(51) Int. Cl.
*G01R 27/28* (2006.01)
*G01N 17/00* (2006.01)
(Continued)

(52) U.S. Cl.
CPC ....... *G01N 17/006* (2013.01); *G01R 19/0092* (2013.01); *G01R 27/00* (2013.01); *G01R 27/02* (2013.01); *G01R 27/08* (2013.01); *G01R 27/26* (2013.01); *G01R 27/2605* (2013.01); *G01R 27/28* (2013.01); *G01R 31/50* (2020.01); *G01R 31/52* (2020.01); *H05K 1/181* (2013.01);
(Continued)

(58) Field of Classification Search
CPC .... G01R 27/02; G01R 27/2605; G01R 27/00; G01R 19/0092; G01R 27/26; G01R 31/50; G01R 27/08; G01R 31/52

USPC ................... 324/76.11–76.83, 459, 600, 649
See application file for complete search history.

(56) References Cited

U.S. PATENT DOCUMENTS

2016/0231375 A1*  8/2016  Roemer ................. G01R 31/52
2017/0181282 A1*  6/2017  Ishida ..................... H05K 1/144
(Continued)

FOREIGN PATENT DOCUMENTS

JP    H03-158748 A    7/1991
JP    H10300699 A    11/1998
(Continued)

OTHER PUBLICATIONS

An Office Action mailed by the Japanese Patent Office dated Oct. 23, 2019, which corresponds to Japanese Patent Application No. 2018-008779.
(Continued)

*Primary Examiner* — Raul J Rios Russo
(74) *Attorney, Agent, or Firm* — Studebaker & Brackett PC

(57) ABSTRACT

An object is to provide a deterioration detection sensor of a printed wiring board in which the accuracy of detection is enhanced. A deterioration detection sensor of a printed wiring board is a circuit board which is vertically provided on a printed wiring board, and is soldered to the printed wiring board with a soldering portion at a lower end. The deterioration detection sensor includes a detection surface for detecting a foreign material. The detection surface forms an intersection surface which intersects the planar direction of the printed wiring board. In the deterioration detection sensor as described above, a wiring in the detection surface is broken, and thus the foreign material is detected.

7 Claims, 6 Drawing Sheets

(51) Int. Cl.
*H05K 1/18* (2006.01)
*G01R 27/02* (2006.01)
*G01R 27/26* (2006.01)
*G01R 27/00* (2006.01)
*G01R 19/00* (2006.01)
*G01R 31/50* (2020.01)
*G01R 27/08* (2006.01)
*G01R 31/52* (2020.01)
*H05K 7/14* (2006.01)
*H05K 7/20* (2006.01)

(52) U.S. Cl.
CPC ....... *H05K 7/1427* (2013.01); *H05K 7/20136* (2013.01); *H05K 2201/10151* (2013.01)

(56) References Cited

U.S. PATENT DOCUMENTS

2017/0271282 A1* 9/2017 Lin ................... H01L 23/49822
2017/0293382 A1* 10/2017 Ishii ..................... G06F 3/041
2017/0308192 A1* 10/2017 Ogura .................... G06F 3/041
2018/0288270 A1* 10/2018 Amano ............... H01L 31/0203

FOREIGN PATENT DOCUMENTS

| JP | 2001-251026 A | 9/2001 |
| JP | 2001-358429 A | 12/2001 |
| JP | 2005-026423 A | 1/2005 |
| JP | 2008051505 A | 3/2008 |
| JP | 2014178177 A | 9/2014 |
| JP | 2015145864 A | 8/2015 |
| JP | 2017020845 A | 1/2017 |

OTHER PUBLICATIONS

An Office Action mailed by the Japanese Patent Office dated Feb. 18, 2020, which corresponds to Japanese Patent Application No. 2018-008779 and is related to U.S. Appl. No. 16/234,111.

* cited by examiner

DETERIORATION DETECTION SENSOR OF PRINTED WIRING BOARD

This application is based on and claims the benefit of priority from Japanese Patent Application No. 2018-008779, filed on 23 Jan. 2018, the content of which is incorporated herein by reference.

BACKGROUND OF THE INVENTION

Field of the Invention

The present invention relates to a deterioration detection sensor of a printed wiring board.

Related Art

Conventionally, since the control device of a machine tool is operated under an environment in which a foreign material such as a cutting fluid is converted into mist, the foreign material is disadvantageously adhered such that a failure occurs in a printed wiring board. Hence, a structure is proposed in which a sensor for detecting a foreign material such as a cutting fluid is provided in a printed wiring board, and in which thus a failure is predicted. For example, patent documents 1 and 2 disclose a structure in which a sensor is provided in a position that is easily deteriorated.

Patent Document 1: Japanese Unexamined Patent Application, Publication No. 2001-358429

Patent Document 2: Japanese Unexamined Patent Application, Publication No. 2001-251026

SUMMARY OF THE INVENTION

In order for the accuracy of detection to be enhanced, a large amount of foreign material is required to be adhered to the sensor as described above. However, when a sensor is formed with a copper foil pattern in a printed wiring board, since the height of the sensor itself is low, it is difficult to adhere a large amount of foreign material to the sensor, with the result that it is impossible to enhance the accuracy of detection.

The present invention is made in view of the foregoing problem, and an object thereof is to provide a deterioration detection sensor of a printed wiring board in which the accuracy of detection is enhanced.

(1) The present invention related to a deterioration detection sensor (for example, a deterioration detection sensor 5, 25, 35, 45 which will be described later) of a printed wiring board including: a sensor main body (for example, a deterioration detection sensor 5 and a sensor main body 16 which will be described later) which is provided on a printed wiring board for example, a printed wiring board 2 which will be described later) and which includes a detection surface (for example, a detection surface 52, 161 which will be described later) for detecting a foreign material, in which an intersection surface (for example, a detection surface 52 and an intersection surface 171, 271, 371, 471 which will be described later) which intersects a planar direction of the printed wiring board is included.

(2) Preferably, in the deterioration detection sensor of the printed wiring board according to (1), the detection surface may form the intersection surface.

(3) Preferably, the deterioration detection sensor of the printed wiring board according to (1) or (2) includes: a separate part (separate part 17, 27, 37, 17 which will be described later) which is a member separate from the sensor main body and which forms the intersection surface so as to drop, to the detection surface, a foreign material adhered thereto.

According to the present invention, it is possible to provide a deterioration detection structure of a printed wiring board in which the accuracy of detection is enhanced.

DETAILED DESCRIPTION OF THE INVENTION

Figure 1:
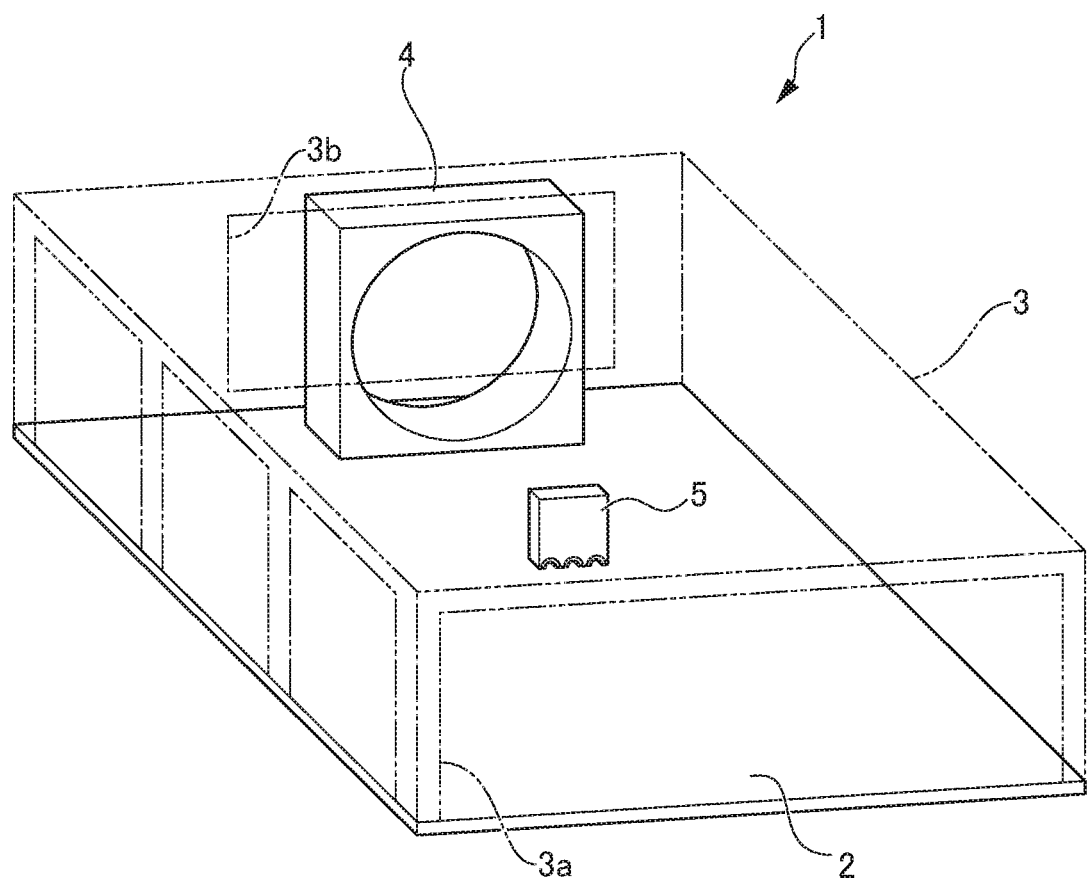
FIG. 1 is a perspective view of a control device which includes a deterioration detection sensor according to a first embodiment of the present invention.

Circuit boards according to embodiments of the present invention will be described with reference to drawings. In the second and subsequent embodiments, the same configurations as in the first embodiment are identified with the same reference numerals, the corresponding configurations are identified with reference numerals having the same regularity and the description thereof will be omitted as necessary. In the second and subsequent embodiments, the description of the same actions and effects as in the first embodiment will be omitted as necessary.

First Embodiment

Figure 2:
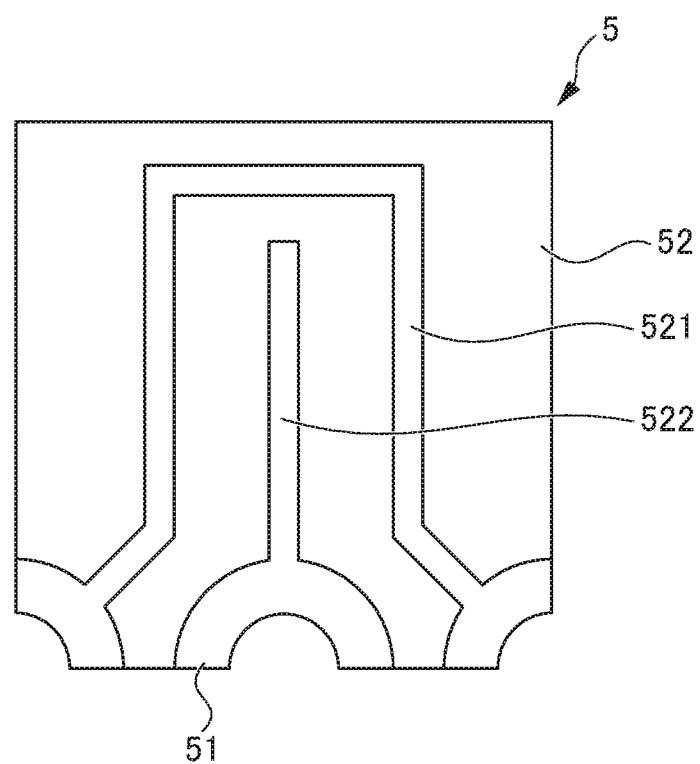
FIG. 2 is a front view of the deterioration detection sensor shown in FIG. 1.

A control device 1 according to the first embodiment will first be described with reference to FIG. 1. FIG. 1 is a perspective view of the control device 1 which includes a deterioration detection sensor 5. FIG. 2 is a front view of the deterioration detection sensor 5.

As shown in FIG. 1, the control device 1 is applied to a machine tool, a robot controller and the like. The control device 1 includes a printed wiring board 2, a cover 3, a fan 4 and the deterioration detection sensor 5.

The printed wiring board 2 is a circuit board to which the deterioration detection sensor 5 is soldered, and is superior in resistance to foreign material to the deterioration detection sensor (sensor main body) 5. The printed wiring board 2 forms the housing of the control device 1 together with the cover 3. Examples of the foreign material include a cutting fluid, a liquid containing chlorine or sulfur, water, dust and chips.

The cover 3 is a lid which covers the printed wiring board 2 so as to form a space above the printed wiring board 2, and forms the housing of the control device 1 together with the printed wiring board 2. In the front and sides of the cover 3, openings 3a for heat dissipation are formed. In the back of the cover 3, a fan 4 for heat dissipation is arranged.

The fan 4 is rotated so as to discharge air within the housing formed with the printed wiring board 2 and the cover 3 through an opening 3b. In this way, externa air is taken into the housing formed with the printed wiring board 2 and the cover 3 through the openings 3a, and thus an air current is generated.

The deterioration detection sensor 5 is a circuit board which is vertically provided on the printed wiring board 2, and is soldered to the printed wiring board 2 with a soldering portion 51 at a lower end. As shown in FIG. 2, the deterioration detection sensor 5 includes the soldering portion 51 and a detection surface 52. The soldering portion 51 is formed of a material (for example, copper) which can be energized, and is soldered to the printed wiring board 2. The detection surface 52 forms an intersection surface which intersects the planar direction of the printed wiring board 2. In the detection surface 52, a wiring 521 and a wiring 522 which is fixed to a potential different from the wiring 521 are formed. The wiring 521 and the wiring 522 are formed of a material (for example, copper) which can be energized, and the conductors of these wirings are exposed to the entire surface of the detection surface 52. Since the wiring 521 and the wiring 522 have different potentials, when a foreign material is adhered, electric corrosion occurs, with the result that the deterioration of the wiring 521 progresses faster. Consequently, the wiring 521 is broken, and thus the deterioration detection sensor 5 can detect the foreign material.

With the deterioration detection sensor 5 of the present embodiment, for example, the following effect is achieved. The deterioration detection sensor 5 of the present embodiment is a sensor main body which is provided on the printed wiring board 2 and which includes the detection surface 52 for detecting a foreign material, and the detection surface 52 forms the intersection surface which intersects the planar direction of the printed wiring board 2. Hence, the detection surface 52 for detecting a foreign material forms the intersection surface which intersects the planar direction of the printed wiring board 2, and thus the detection surface 52 prevents the air current (mainly, an air current flowing from the side of the openings 3a toward the fan 4) which is generated within the housing formed with the printed wiring board 2 and the cover 3. In this way, a foreign material in the air current is easily adhered to the detection surface 52, and thus it is possible to enhance the accuracy of detection of the foreign material.

Second Embodiment

Figure 3:
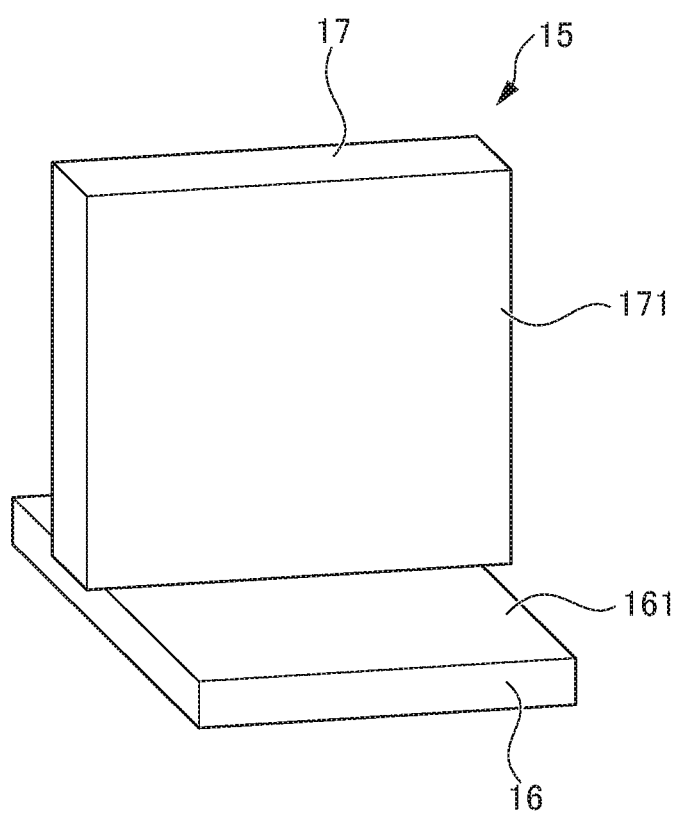
FIG. 3 is a perspective view of a deterioration detection sensor according to a second embodiment of the present invention.

A deterioration detection sensor 15 according to a second embodiment will then be described with reference to FIG. 3. FIG. 3 is a perspective view of the deterioration detection sensor 15. The deterioration detection sensor 15 according to the present embodiment differs from the first embodiment in that, for example, a separate part 17 which is a member separate from a sensor main body 16 is included.

As shown in FIG. 3, the deterioration detection sensor 15 includes the sensor main body 16 and the separate part 17. The sensor main body 16 is a circuit board which is stacked as a layer on a printed wiring board (unillustrated), and is soldered to the printed wiring board (unillustrated). In the sensor main body 16, its upper surface forms a detection surface 161. The separate part 17 is formed in the shape of a rectangular flat plate, and is vertically provided on the sensor main body 16. The separate part 17 may be formed of any material as long as the material is a material, such as a metal or a resin, which does not depart from the spirit of the present invention. The separate part 17 as described above includes an intersection surface 171 which intersects the planar direction of the printed wiring board (unillustrated) and the deterioration detection sensor 15 so as to drop the foreign material adhered to the intersection surface 171 to the detection surface 161.

With the deterioration detection sensor 15 of the present embodiment, for example, the following effect is achieved. The deterioration detection sensor 15 of the present embodiment includes the sensor main body 16 which is provided on the printed wiring board (unillustrated) and which includes the detection surface 161 for detecting a foreign material, and the intersection surface 171 which intersects the planar direction of the printed wiring board (unillustrated). The deterioration detection sensor 15 includes the separate part 17 which is the member separate from the sensor main body 16 and which forms the intersection surface 171 so as to drop, to the detection surface 161, the foreign material adhered thereto. Hence, the intersection surface 171 of the separate part 17 prevents an air current which is generated within a housing formed with the printed wiring board (unillustrated) and a cover (unillustrated). In this way, a foreign material in the air current is easily adhered to the intersection surface 171, and thus the foreign material adhered to the intersection surface 171 is easily dropped to the detection surface 161, with the result that it is possible to enhance the accuracy of detection of the foreign material.

Third Embodiment

Figure 4:
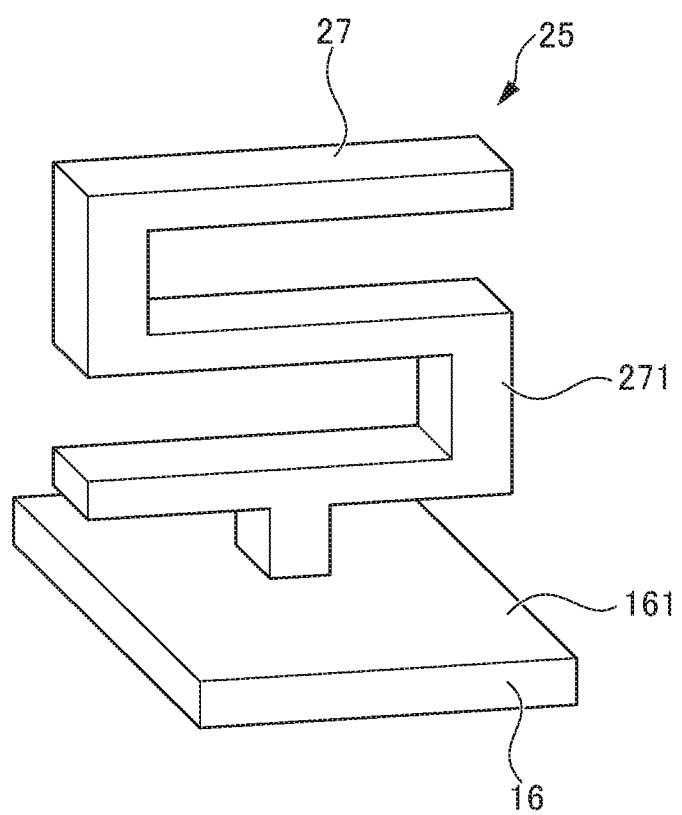
FIG. 4 is a perspective view of a deterioration detection sensor according to a third embodiment of the present invention.

A deterioration detection sensor 25 according to a third embodiment will then be described with reference to FIG. 4. FIG. 4 is a perspective view of the deterioration detection sensor 25. The deterioration detection sensor 25 according to the present embodiment differs from the second embodiment in that instead of the separate part 17, a separate part 27 is included.

As shown in FIG. 4, the deterioration detection sensor 25 includes a sensor main body 16 and the separate part 27. The separate part 27 is thin-walled and is formed in the shape of the letter S, and is vertically provided on the sensor main body 16. The separate part 27 includes an intersection surface 271 which intersects the planar direction of a printed wiring board (unillustrated) and the deterioration detection sensor 15 so as to drop a foreign material adhered to the intersection surface 271 to a detection surface 161. As with the intersection surface 271, the present invention may be a structure which roughly interrupts an air current.

Fourth Embodiment

Figure 5:
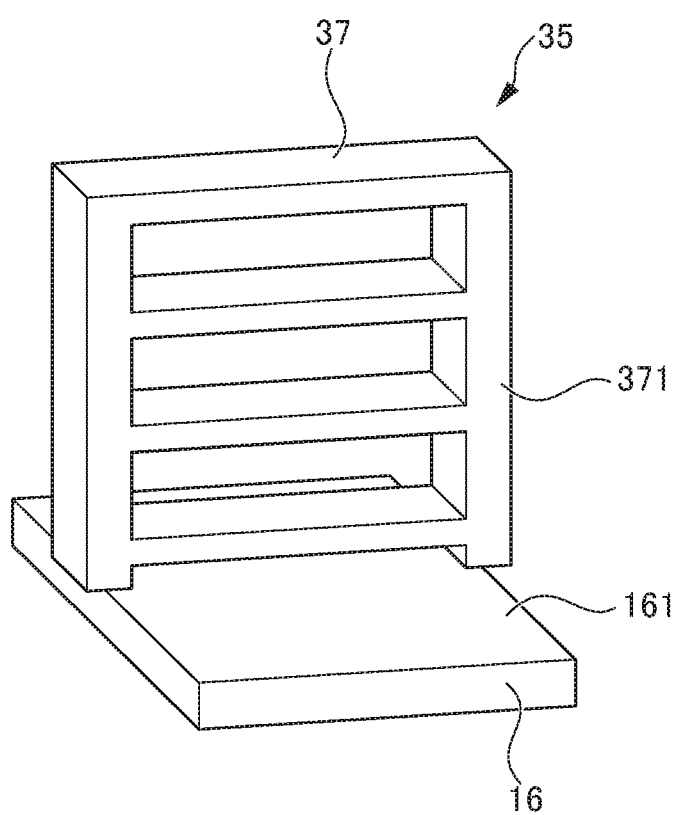
FIG. 5 is a perspective view of a deterioration detection sensor according to a fourth embodiment of the present invention.

A deterioration detection sensor 35 according to a fourth embodiment will then be described with reference to FIG. 5. FIG. 5 is a perspective view of the deterioration detection sensor 35. The deterioration detection sensor 35 according to the present embodiment differs from the second embodiment in that instead of the separate part 17, a separate part 37 is included.

As shown in FIG. 5, the deterioration detection sensor 35 includes a sensor main body 16 and the separate part 37. The separate part 37 is thin-walled and is formed in the shape of a Chinese character "eye", and is vertically provided on the sensor main body 16. The separate part 37 includes an intersection surface 371 which intersects the planar direction of a printed wiring board (unillustrated) and the deterioration detection sensor 35 so as to drop a foreign material adhered to the intersection surface 371 to a detection surface 161.

Fifth Embodiment

Figure 6:
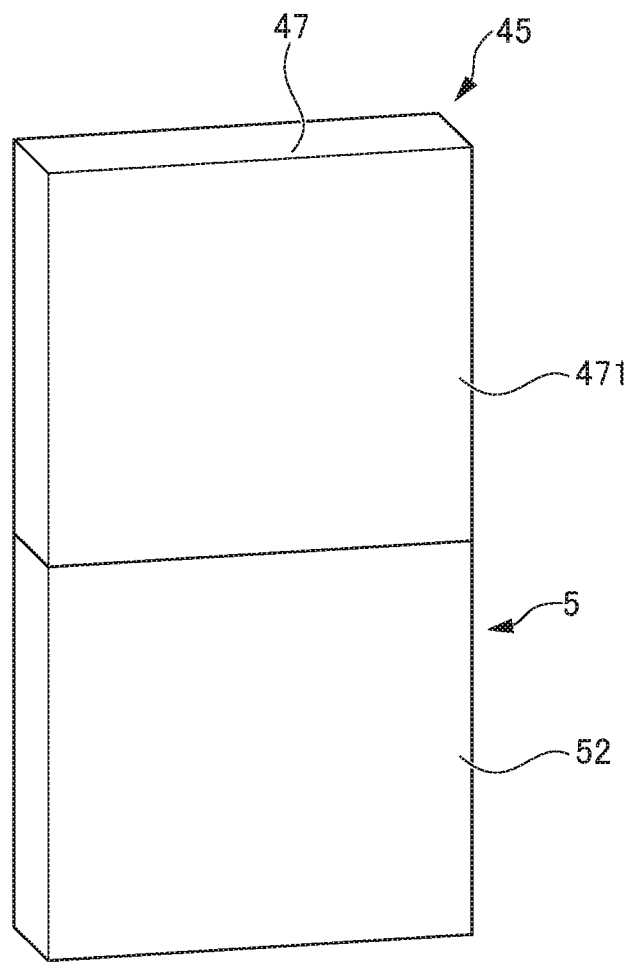
FIG. 6 is a perspective view of a deterioration detection sensor according to a fifth embodiment of the present invention.

A deterioration detection sensor 45 according to a fifth embodiment will then be described with reference to FIG. 6. FIG. 6 is a perspective view of the deterioration detection sensor 45. The deterioration detection sensor 45 according to the present embodiment differs from the first embodiment in that a separate part 47 is further included.

As shown in FIG. 6, the deterioration detection sensor 45 includes a sensor main body 5 and the separate part 47. The separate part 47 is formed in the shape of a rectangular flat plate, and is vertically provided on the sensor main body 5. The separate part 37 includes an intersection surface 471 which intersects the planar direction of a printed wiring board 2 (see FIG. 1) so as to drop a foreign material adhered to the intersection surface 471 to a detection surface 52.

The present invention is not limited to the embodiments described above, and various modifications and variations are possible. For example, although in the embodiments described above, the detection surface 52 and the intersection surfaces 171, 271, 371 and 471 are formed in the shape of a rectangular flat plate, thin-walled and formed in the shape of the letter S or formed in the shape of a Chinese character "eye", there is no limitation to these shapes. The detection surface 52 and the intersection surfaces 171, 271, 371 and 471 may have any shape as long as they have an intersection surface which intersects the planar direction of the printed wiring board. Although the detection surface 52 and the intersection surfaces 171, 271, 371 and 471 are vertically provided on the printed wiring board, there is no limitation to this configuration. The detection surface 52 and the intersection surfaces 171, 271, 371 and 471 may have any configuration as long as they are provided so as to intersect the planar direction of the printed wiring board.

EXPLANATION OF REFERENCE NUMERALS

- 1 control device
- 2 printed wiring board
- 3 cover
- 3*a*, 3*b* opening
- 4 fan
- 5 deterioration detection sensor (sensor main body)
- 51 soldering portion
- 52 detection surface (intersection surface)
- 521 wiring
- 52A coating region
- 52B exposure region
- 15, 25, 35, 45 deterioration detection sensor
- 16 sensor main body
- 161 detection surface
- 17, 27, 37, 47 separate part
- 171, 271, 371, 471 intersection surface

What is claimed is:

1. A deterioration detection sensor of a printed wiring board, the deterioration detection sensor comprising:
    a sensor main body which is provided on the printed wiring board and which includes a detection surface for detecting a foreign material,
    wherein an intersection surface which intersects and extends in a direction that is orthogonal to a planar direction of the printed wiring board is included, and the intersection surface is oriented with respect to the printed wiring board to interrupt an air current in the planar direction.

2. The deterioration detection sensor of the printed wiring board according to claim 1, wherein the detection surface forms the intersection surface.

3. The deterioration detection sensor of the printed wiring board according to claim 1, the deterioration detection sensor comprising: a separate part which is a member separate from the sensor main body and which forms the intersection surface so as to drop, to the detection surface, a foreign material adhered thereto.

4. The deterioration detection sensor of the printed wiring board according to claim 2, the deterioration detection sensor comprising: a separate part which is a member separate from the sensor main body and which forms the intersection surface so as to drop, to the detection surface, a foreign material adhered thereto.

5. The deterioration detection sensor of the printed wiring board according to claim 1, wherein the detection surface extends in the direction that is orthogonal to the planar direction of the printed wiring board.

6. The deterioration detection sensor of the printed wiring board according to claim 1, wherein the detection surface extends in the planar direction of the printed wiring board.

7. A deterioration detection sensor of a device including a printed wiring board, a housing, a cover which has an opening for taking air, and a fan which generates an air current flowing through the opening towards inside of the housing, the deterioration detection sensor comprising:
    a sensor main body which is provided on the printed wiring board, the sensor main body including a detection surface for detecting a foreign material; and
    a separate part having an intersection surface which vertically intersects the detection surface for interrupting the air current so as to drop a foreign material adhered thereon towards the detection surface, wherein the separate part is distinct from the sensor main body.

* * * * *